April 5, 1966 J. M. CRISHAL ETAL 3,244,567

IMPURITY DIFFUSION METHOD

Filed Sept. 10, 1962

JOAN M. CRISHAL,
THEODORE J. LACHAPELLE,
JAMES P. SANDSTROM,
WILLIAM R. WILCOX,
INVENTORS.

BY THEIR ATTORNEYS.

Spensley & Horn.

United States Patent Office 3,244,567
Patented Apr. 5, 1966

3,244,567
IMPURITY DIFFUSION METHOD

Joan M. Crishal, Torrance, Theodore J. La Chapelle, Los Angeles, William R. Wilcox, Torrance, and James P. Sandstrom, Los Angeles, Calif., assignors to TRW Semiconductors, Inc., a corporation of Delaware
Filed Sept. 10, 1962, Ser. No. 222,288
8 Claims. (Cl. 148—189)

This invention relates to diffused junction type semiconductor devices and more particularly to a new method for diffusing active impurities into semiconductor materials.

The term "semiconductor material," as utilized herein, is considered generic to germanium, silicon and the germanium-silicon alloys and is employed to distinguish these semiconductors from metallic oxide semiconductors such as copper oxide.

The term "active impurity" is utilized herein to denote those impurities which affect the electrical rectification characteristics of semiconductor materials as distinguished from other impurities which have no appreciable effect upon these characteristics. Active impurities are ordinarily classified as donor impurities, such as phosphorus, arsenic and antimony, or acceptor impurities, such as boron, gallium, aluminum and indium.

In the semiconductor art, a region of semiconductor material containing an excess of donor impurities and yielding an excess of free electrons is considered to be an impurity doped N type region. An impurity doped P type region is one containing an excess of acceptor impurities resulting in a deficit of electrons, or an excess of holes. Stated differently, an N type region is one characterized by electron conduction, whereas a P type region is one characterized by hole conduction. When a continuous solid specimen of crystal semiconductor material has an N type region adjacent a P type region, the boundary between them is termed a PN or NP junction and the specimen of semiconductor material is termed a PN junction semiconductor device. These PN and NP junctions are referred to as rectifying junctions.

When donor impurity atoms are diffused into an N type semiconductor starting crystal of a given resistivity, a diffused N type region of a different resistivity is produced. The gradation between these two regions of similar conductivity type but of differing resistivity is termed a non-rectifying junction and may be used for producing an ohmic contact. The term "junction," as utilized herein, is intended to include both rectifying and non-rectifying junctions. The method of the present invention is particularly adapted to the production of both rectifying and non-rectifying junctions by the phenomenon of diffusion of atoms of an active impurity, namely phosphorus, into the semiconductor starting crystal.

At the present state of the art, the impurity doping of semiconductor material is generally accomplished by an open-tube diffusion process involving the vapor-solid diffusion of the desired impurity in a furnace in which certain gases are introduced to control the ambient therein. A typical process of this type is described in U.S. Patent No. 2,802,760, entitled "Oxidation of Semiconductive Surfaces for Controlled Diffusion" by L. Derick and C. Frosch, issued August 13, 1957. In this widely used method, diffusion of phosphorus atoms into the surface of a silicon semiconductor crystal wafer is accomplished by flowing phosphorus atom-containing vapors past the silicon wafer maintained in a diffusion furnace at a temperature of approximately 1200° C. The desired vapors are obtained by disposing a quantity of phosphorous pentoxide ($P_2O_5$) in the furnace near the inlet where the temperature is approximately 350° C., this temperature being sufficient to vaporize the $P_2O_5$. A stream of inert carrier gas, such as nitrogen, for example, is then directed over the $P_2O_5$ and the resultant gas flowed past the silicon wafer in the hot zone of the furnace, whereupon a shallow phosphorus-diffused region forms on the silicon wafer.

The present art phosphorus diffusion method, as described hereinabove, is not without its disadvantages. It is difficult to control the amount of $P_2O_5$ deposited on the silicon wafers, particularly when low concentrations are required. Occasionally, solid particles of $P_2O_5$ are blown through the furnace tube and settle on the silicon wafer, thereby rendering it even more difficult to control the amount of $P_2O_5$ deposited. Furthermore, since $P_2O_5$ absorbs moisture quite rapidly, removal of the damp portions of the $P_2O_5$ becomes necessary. Also, the excess $P_2O_5$ deposits as a sticky mixture in the furnace tube and requires frequent removal. Accordingly, the present invention is specifically directed toward an improved phosphorus vapor diffusion technique in which the amount of $P_2O_5$ deposited can be simply and accurately controlled.

It is, therefore, an object of the present invention to provide an improved vapor diffusion technique.

It is also an object of the present invention to provide an improved method for diffusing active impurities into semiconductor materials.

It is a further object of the present invention to provide an improved vapor diffusion technique for depositing phosphorus pentoxide vapors on the surface of semiconductor materials.

It is a still further object of the present invention to provide an improved vapor diffusion technique for depositing completely dry, phosphorus pentoxide vapors on the surface of semiconductor materials.

It is another object of the present invention to provide an improved vapor diffusion technique in which the deposition of the active impurity atoms can be accurately controlled.

It is still another object of the present invention to provide a relatively simple and improved phosphorus vapor diffusion technique.

It is also an object of the present invention to provide an improved method for depositing phosphorus pentoxide vapors on semiconductor materials.

It is yet another object of the present invention to provide an improved open-tube diffusion process for the deposition of phosphorus pentoxide vapors on semiconductor materials.

In contrast to the prior art method of deriving phosphorus pentoxide vapors from solid phosphorus pentoxide, the objects of the present invention are accomplished, in general, by generating phosphorus pentoxide in the diffusion furnace by heating oxygen and a volatile, anhydrous phosphorus containing substance which upon oxidation produces anhydrous $P_2O_5$ without simultaneous deposition of carbonaceous material.

The novel features which are believed to be characteristic of the invention, both as to its organization and method of operation, together with further objects and advantages thereof, will be better understood from the following description in which presently preferred embodiments of the invention are presented by way of example.

It is to be expressly understood, however, that the description is for the purpose of illustration only and that the true spirit and scope of the invention is defined by the accompanying claims.

Figures 1, 3:
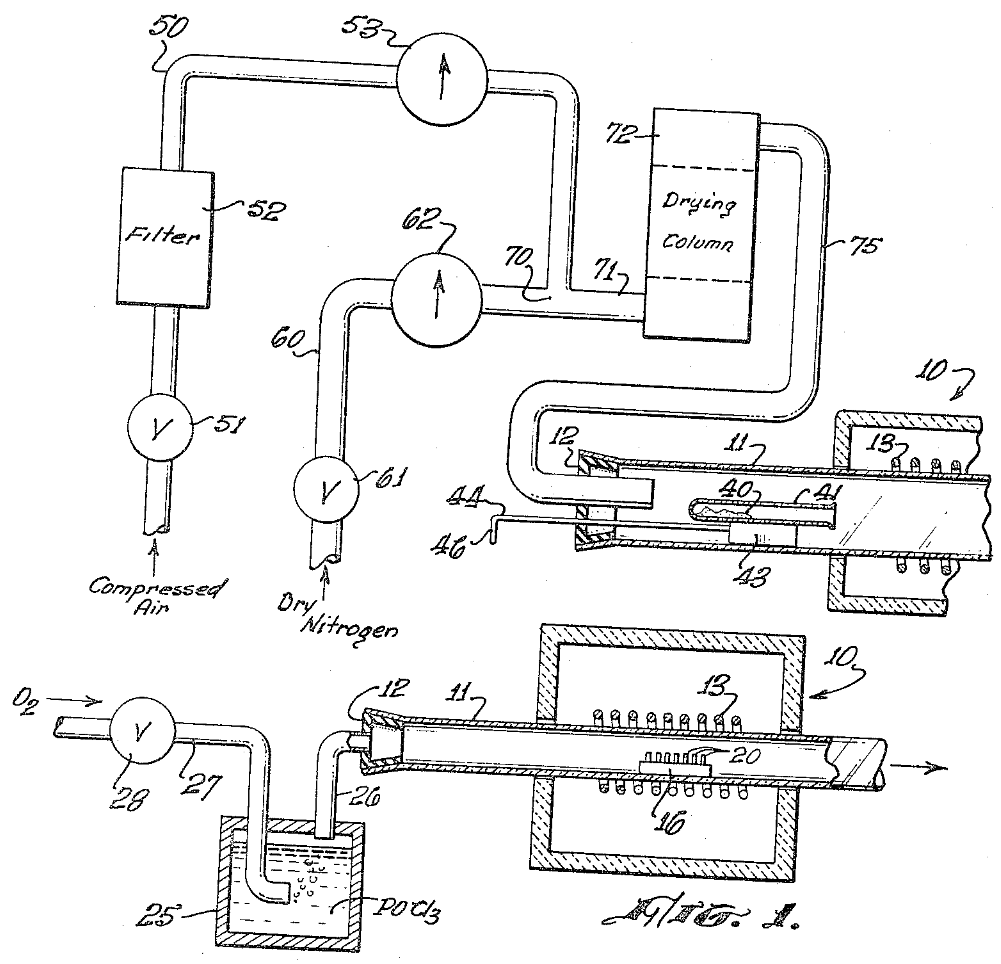
FIGURE 1 is a schematic flow diagram depicting performance of the present invention method when utilizing a phosphorus containing substance in liquid form.
FIGURE 3 is a schematic flow diagram depicting performance of the present invention method when utilizing a phosphorus containing substance in solid form.

The present invention method is based upon the concept of forming anhydrous $P_2O_5$ in situ within the furnace, rather than by starting with solid $P_2O_5$ and vaporizing it to provide the desired vapors. By deriving the $P_2O_5$ from an anhydrous, volatile phosphorus containing substance, all of the $P_2O_5$ produced is in anhydrous vapor form. However, since some of the organic phosphorus compounds which are anhydrous and volatile also produce carbonaceous byproducts, the general criteria for suitable starting substances, in accordance with the present invention concepts, is that the starting substance must be a volatile phosphorus containing substance which upon oxidation produces anhydrous $P_2O_5$ without simultaneous deposition of carbonaceous materials. In general, of the organic phosphorus compounds, aromatic compounds usually produce carbonaceous byproducts while the aliphatics and small chain materials do not. Hence, it would be expected that paraffin hydrocarbon derivatives of a phosphorus halide, of phosphine, or of a phosphonium halide, should be suitable, depending on the manner in which the compound is linked to the phosphorus. The non-organic anhydrous, volatile phosphorus containing substances can be classified generally as elemental phosphorus, the phosphorus halides (including oxy-halides) and the mixed phosphorus halides.

Following is a tabulation showing certain physical characteristics of elemental phosphorus, the phosphorus halides and oxy-halides, and the mixed phosphorus halides. The table shows the form of the substance at room temperature, its melting point, its boiling point (or decomposition temperature), and its reactivity with moist air at room temperature.

*Table I*

| Phosphorus containing Substance | Form | Melting Point, °C. | Boiling Point, °C. | Reaction with Moist Air at Room Temperature |
|---|---|---|---|---|
| $P_4$ (element, red) | Solid | +590 | +725 | Stable. |
| $P_4$ (elemental, white) | do | +44 | +280 | Do. |
| $PF_3$ | Gas | −152 | −102 | Stable when pure. |
| $PFCl_3$ | do | −144 | +14 | Hydrolyzes slowly. |
| $PF_2Cl$ | do | −165 | −47 | Hydrolyzes very slowly. |
| $PF_2Br$ | Liquid | −134 | −16 | Fumes. |
| $PFBr_2$ | do | −115 | +78 | Do. |
| $PF_5$ | Gas | −94 | −85 | Do. |
| $PF_3Cl_2$ | do | −8 | +10 | |
| $PF_3Br_2$ | Solid | −20 | +106 | |
| $PCl_3$ | Liquid | −94 | +76 | Fumes. |
| $P_2Cl_4$ | do | −28 | +180 | |
| $PBrCl_4$ | Solid | ? | ? | |
| $PCl_5$ | do | +167 | +160 | |
| $PBr_2Cl_3$ | do | [1] +35 | ---------- | |
| $PBr_7Cl_2$ | do | ? | ? | |
| $PBr_8Cl_3$ | do | +25 | ? | |
| $PBr_3$ | Liquid | −41 | +173 | Fumes. |
| $PBr_5$ | Solid | +100 | [1] +106 | |
| $PI_3$ | do | −28 | [1] >200 | Hydrolyzes. |
| $P_2I_4$ | do | +125 | ([1]) | |
| $PCl_3I_2$ | do | ? | ? | |
| $POF_3$ | Gas | −68 | −40 | |
| $POF_2Cl$ | do | −39 | +3 | |
| $POFCl_2$ | Liquid | −80 | +53 | |
| $POF_2Br$ | do | −85 | +32 | |
| $POCl_3$ | do | +1 | +106 | Fumes |
| $POBrCl_2$ | do | +13 | +138 | |
| $POBr_3$ | Solid | +55 | +192 | |
| $POBr_2Cl$ | Liquid | +30 | +165 | |

[1] Decomposes.

Although elemental phosphorus has no significant tendency to react with moist air, the halides, oxy-halides and mixed halides have varying tendencies to react with moist air, the ones having the lowest atomic numbers usually having the least reaction tendency. Thus, the fluorides and oxy-fluorides are the best in this regard, with the trifluorides better than the pentafluorides, and the poorest being the iodides. To alleviate moisture contamination of the more reactive substances, the substances can be dried by heating if in the solid form and solid $P_2O_5$ can be added to those in liquid form to react with the excess water and produce combinations which are non-volatile at working temperatures. Other considerations in the selection of a particular one of the suitable substances are the ease and safety of handling, and the form of the substance at room temperature.

With reference now to the drawings, wherein like or corresponding parts are designated by the same reference characters throughout the several views, there are shown in the various figures suitable apparatus for use in performance of the present invention method with various forms of phosphorus containing substances. In FIGURE 1 of the drawing, there is shown apparatus suitable for performance of the present invention diffusion process when utilizing phosphorus containing substances which are in liquid form at room temperature and which possess a relatively high vapor pressure. The apparatus includes an open-tube diffusion furnace, generally indicated by the reference numeral 10, of the type well known in the art. The furnace 10 contains an elongated quartz tube 11, with the left-hand end of the tube being shown as the input end. The input end is provided with an inlet 12 through which the desired doping atmosphere is introduced into the furnace for continuous flow toward the right-hand, or outlet end of the tube. Heating coils 13 surround an intermediate portion of the tube 11 to define the furnace hot zone. Disposed within the hot zone of the furnace is a quartz boat 16 containing a plurality of silicon wafers 20 into which it is desired to diffuse phosphorus atoms.

A glass bubbler 25 containing a suitable phosphorus containing liquid, phosphorus oxy-chloride, for example, is positioned near the inlet 12 and connected thereto by a pipe 26. A feed line 27, including a throttle valve 28, is provided to flow oxygen into the bubbler. In operation, oxygen from a suitable supply source (not shown) is flowed through the bubbler 25, the valve 28 in the feed line 27 providing adjustment of the rate of flow. Upon bubbling of the oxygen through the liquid phosphorus oxy-chloride, the oxygen becomes saturated with $POCl_3$ and the resultant gas mixture flows into the inlet 12 and through the furnace tube 11 where oxidation of the phosphorus oxy-chloride vapors forms anhydrous $P_2O_5$ which is then deposited on the silicon wafers 20. The anhydrous $P_2O_5$ is generated within the furnace tube 11 by the reaction of the oxygen and the phosphorus oxy-chloride vapor, oxygen replacing chlorine in the molecule as follows:

$$4POCl_3 + 3O_2 \xrightarrow[\Delta]{} 2P_2O_5 + 6Cl_2$$

The evolved chlorine does not etch the silicon, because of the oxidizing atmosphere.

The apparatus shown in FIGURE 1 is particularly useful in the diffusion of the emitter region in silicon transistors. As a practical example of the use of the apparatus of FIGURE 1, the quartz tube 11 has an inner diameter of 2 inches, the hot zone of the furnace 10 being typically maintained at a temperature of about 1045° C. The oxygen flow rate for a 2-inch diameter tube is approximately 1 cubic foot per hour. An oxygen flow rate of about 2½ cubic feet per hour is presently preferred for a tube having an inner diameter of 2¼ inches. In order to prevent the production of an excessive amount of $P_2O_5$, the temperature of the phosphorus oxy-chloride contained within the glass bubbler 25 is maintained at approximately 0° C. by disposing the bubbler in an ice water bath. The diffusion time depends upon the depth of penetration desired, approximately 75 minutes providing a diffusion depth of 2.1 microns.

The bubbling of pure oxygen through the liquid phosphorus oxy-chloride sometimes tends to result in an uneven dispersion of the phosphorus atoms on the silicon surface in that the depth of the phosphorus penetration in the silicon wafers farthest away from the inlet end of the furnace is less than that of the wafers closer to the inlet of the furnace. A more even dispersion can be achieved by mixing up to 50% nitrogen with the oxygen pumped into the system. If an excessive amount of nitrogen is used, i.e., greater than 50%, then a bubbling effect is achieved during the phosphorus deposition, the bubbles later breaking to provide uneven dispersion spots. It is presently preferred to heat the silicon wafers in the furnace for about five minutes in an oxygen atmosphere before the diffusant is admitted. This can be accomplished by using an arrangement similar to that shown in FIGURE 2.

Figure 2:
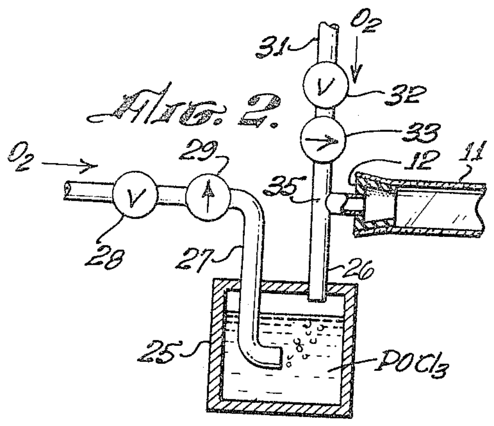
FIGURE 2 is a schematic flow diagram depicting a variation in the performance of the present invention method when utilizing a phosphorus containing substance in liquid form.

Turning now to FIGURE 2 of the drawing, there is shown an alternative embodiment for performing the method of the present invention when utilizing phosphorus containing substances in liquid form. The embodiment of FIGURE 2 enables maintenance of phosphorus oxychloride at room temperature without an excessive production of $P_2O_5$. In the FIGURE 2 embodiment, a flowmeter 29 has been inserted in the feed line 27 after the throttle valve 28 in order to continuously monitor the amount of oxygen being fed through the bubbler. In this embodiment, an additional feed pipe 31 is coupled to the oxygen source, the oxygen fed through a throttle valve 32 and a flowmeter 33 to a T-junction 35 and thence into the inlet 12. The other leg of the T-junction is coupled to the glass bubbler 25 for the conduction of vapors from the bubbler to the inlet 12. To achieve the aforementioned desired one cubic foot per minute flow rate without an excessive production of $P_2O_5$ vapors within the furnace, the valve 28 is adjusted to provide a one-quarter cubic foot per hour flow rate of oxygen into the bubbler, the valve 32 being adjusted to provide a ¾ cubic foot per hour flow rate of oxygen through the feed pipe 31. The valves are easily adjusted by observance of the flowmeters 29 and 33. At the beginning of the run the valve 28 is closed and the valve 32 opened, thereby assuring establishment of an oxidizing atmosphere in the furnace before admission of the diffusant.

In FIGURE 3 of the drawing, there is shown the presently preferred method of performing the present invention utilizing phosphorus containing substances in solid form. Of the suitable phosphorus containing substances which are in solid form at room temperature, elemental (red) phosphorus is presently preferred since it has no significant tendency to react with moisture and since it is commercially available in ultra-pure form. Hence, the operation of the apparatus illustrated in FIGURE 3 will be applied to a specific example utilizing red phosphorus. A quantity of red phosphorus 40 is disposed in a closed end quartz tube 41, and the quartz tube 41 inserted into the furnace tube 11 and maintained near its inlet end. The quartz tube 41 is supported by a block 43 of refractory material. One end of an elongate push rod 44 is attached to the block 43, the push rod 44 extending through the furnace inlet 12 and terminating in a handle portion 46. By means of the push rod 44, the operator can adjust the position of the quartz tube 41 within the furnace tube 11 in a manner to be hereinafter explained.

A gas feed line 50 is coupled to a source of compressed air, not shown. A throttle valve 51, a filter 52 and a flowmeter 53 are provided in the feed line 50. Another feed line 60 is coupled to a source of dry nitrogen, not shown. The feed line 60 is provided with a throttle valve 61 and a flowmeter 62 to enable adjustment of the gas flow rate therethrough. The gas feed lines 50 and 60 join at a T junction 70, the combined gases flowing through an inlet 71 into a drying column 72 wherein water vapor is removed. The dry gas mixture emerging from the drying column 72 is fed through a feed line 75 into the furnace inlet 12.

In a specific example of the present invention method utilizing the apparatus shown in FIGURE 3, about 0.74 gram of red phosphorus is placed in the quartz tube 41, the tube 41 having a length of about 10 centimeters. The phosphorus is tamped down into the closed end of the tube and dryed in a vacuum oven for about 5 minutes at 100° C. The tube 41 containing the phosphorus is then placed on the block 43 within the furnace tube 11, with the open end of the quartz tube 41 facing into the furnace. The hot zone of the furnace is maintained at a temperature of 1000° C. and the block 43 pushed into the furnace until burning of the phosphorus begins at the open end of the tube 41. Burning of the phosphorus will occur when the tube 41 is heated to a temperature of about 350 to 400° C., burning being evidenced by a yellow flame at the tip of the tube 41. A desired atmosphere of about 10% oxygen in nitrogen is formed by opening the valves 51 and 61 until equal flow rates of compressed air and nitrogen are indicated by the flowmeters 53 and 62, the desired atmosphere being introduced into the furnace through the inlet end via the feed tube 75. The burning rate of phosphorus within the furnace is adjusted by movement of the tube 41 within the furnace, and increased burning rate being achieved by sliding the block 43 farther into the furnace by pushing on the handle portion 46 of the push rod 44. The gas flow rate must be sufficient to support the rate of phosphorus combustion desired. However, an excessive flow rate, up to at least 5 SCFH, can be utilized without any apparent adverse effect on the combustion. The combustion rate of the red phosphorus can be adjusted over a wide range, depending upon the $P_2O_5$ deposition required. When using burning rates on the order of 0.01 gram per minute, no particulate matter is visible in the furnace exhaust and no unburned phosphorus is detected in the furnace exhaust or anywhere in the furnace. When utilizing a burning rate of about 0.1 gram per minute, a white smoke issues from the furnace exhaust and, although no unburned phosphorus is detected in the exhaust, a small amount is deposited on the cooler portion of the tube 41.

A diffusion run conducted under the above-specified conditions, wherein the red phosphorus was burned with a gentle flame for 45 minutes and the resulting $P_2O_5$ vapors pass over a 1.6 ohm centimeter P type silicon wafer, a junction depth of 1.5 microns was achieved. The calculated surface concentration was $4\times10^{20}$ atoms per cubic centimeter. A microscopically smooth surface resulted, the nominal sheet resistance being 2.68 ohms with a range of 3% in value.

It is recognized that there may exist some danger of poisonous phosphorus vapor escaping in the furnace exhaust. This danger may be obviated by bubbling the exhaust through a saturated solution of copper nitrate or copper sulfate, the presence of phosphorus vapor being indicated by the appearance of a black precipitate. An additional bubbler filled with an inert fluid, such as silicone oil, for example, may be inserted between the cupric solution and the furnace to prevent water vapor from back-diffusing into the furnace.

In order to provide additional control of the phosphorus burning rate, the phosphorus may be disposed in an elongated mass at the closed end of the quartz tube 41 so that different portions of the phosphorus will be at different temperatures due to the steep temperature gradient within the furnace. Hence, the rate of burning can be controlled by the rate of advance of the tube 41 into the furnace. Alternatively, the phosphorus burning rate could be controlled by disposing the phosphorus in a bulb having a capillary opening. Under such conditions, the burning rate would be nearly constant and would be determined by the temperature of the bulb and the resistance to mass transfer of the phosphorus vapor to the ambient gas. The gas composition is not critical and adequate combustion should occur with an oxygen content within the range of from 5 to 15%. Although nitrogen was used as the inert carrier gas in the illustrated example, other inert gases such as helium or argon, for example, are equally suitable.

When practicing the present invention method utilizing phosphorus containing substances which are in gaseous form at room temperature, a gas feed system similar to that shown in FIGURE 3 of the drawing can be utilized, one gas feed line being coupled to the phosphorus containing gas and the other feed line coupled to an appropriate inert gas source. Regulation of the relative flow rates of the two gases will provide the proper combustion.

In the present invention technique, whether the phosphorus containing substance is in liquid, gaseous or solid form at room temperature, $P_2O_5$ is formed directly as a gaseous molecule (more accurately, as a $P_4O_{10}$ molecule). This is in direct contrast to the prior art method of utilizing solid $P_2O_5$ as a starting material. There are several disadvantages associated with the use of solid $P_2O_5$ as a starting material. $P_2O_5$ absorbs moisture quite rapidly, hence removal of the damp portions of the $P_2O_5$ becomes necessary. Under such conditions, it is difficult to exactly reproduce starting conditions due to the variability of the exact weight and moisture content of the $P_2O_5$. Furthermore, it is difficult to exactly control the rate of evolution and concentration of gaseous phosphorus pentoxide when using standard solid $P_2O_5$ of indefinite vapor pressure. Also, it is difficult to prevent formation of particles in the gaseous stream evolved from standard solid $P_2O_5$, part of the particles being due to the sublimation process itself and part due to relatively nonvolatile complex phosphoric acids formed by reaction of moisture with the $P_2O_5$. Hence, the prior art technique usually gives rise to a hydrated form of $P_2O_5$ (such as phosphoric acid, metaphosphoric acid, or pyrophosphoric acid).

In the present invention technique, in which anhydrous $P_2O_5$ is formed directly as a gaseous molecule, uncontaminated with any phosphoric acid vapors, the aforementioned disadvantages are obviated. Since in the present invention method, the $P_2O_5$ is transported as an uncontaminated gaseous molecule, the surface concentration of the diffused doping impurity in the silicon is quite high and very uniform over the entire surfaces of all of the wafers in the furnace. Furthermore, the deposition rate can be quite closely controlled. When using a phosphorus containing substance which is in solid form at room temperature, the following variables are under the exact and reproducible control of the operator: The amount of starting material; the geometry of the container for the phosphorus containing substance, including orifice size for escape of phosphorus vapor; control of the pressure and flow rate of the feed gases, and the reaction, temperature and time. When using phosphorus containing substances which are in a liquid form at room temperature, the following variables are under the exact and reproducible control of the operator: The feed gas flow rate and composition; the reaction time and temperature; and the temperature of the starting liquid. When using a phosphorus containing substance which is in gaseous form at room temperature, the following variables are under the exact and reproducible control of the operator: The reaction time and temperature; the feed gas flow rate and composition; the phosphorus containing gas flow rate and composition; and the furnace temperature.

Thus, there has been described a novel technique for the controlled diffusion of phosphorus pentoxide vapors into semiconductor materials, the present invention method being capable of exact reproduction and resulting in an even deposition of phosphorus atoms across the surface of the semiconductor materials. Although the invention has been described with a certain degree of particularity, it is understood that the present disclosure has been made only by way of example and that numerous changes in the combination and arrangement of apparatus may be resorted to without departing from the spirit and the scope of the invention as hereinafter claimed.

What is claimed is:

1. The method of diffusing phosphorus atoms into the surface of a body of semiconductor material, comprising the steps of: maintaining the semiconductor body within a furnace heated to a predetermined temperature; maintaining elemental phosphorus within said furnace in a predetermined oxygen bearing atmosphere to thereby generate anhydrous phosphorus pentoxide vapors within said furnace; and transporting the phosphorus pentoxide vapors generated within said furnace past said semiconductor body to thereby cause diffusion of phosphorus atoms into the surface of said semiconductor body.

2. The method of diffusing phosphorus atoms into the surface of a body of semiconductor material, comprising the steps of: maintaining the semiconductor body within a furnace heated to a predetermined temperature; maintaining elemental red phosphorus within said furnace in a predetermined oxygen bearing atmosphere to thereby generate anhydrous phosphorus pentoxide vapors within said furnace; and, transporting the phosphorus pentoxide vapors generated within said furnace past said semiconductor body to thereby cause diffusion of phosphorus atoms into the surface of said semiconductor body.

3. The method of diffusing phosphorus atoms into the surface of a silicon semiconductor wafer, comprising the steps of: maintaining the silicon wafer within a furnace heated to a predetermined temperature; bubbling oxygen through phosphorus oxy-chloride at a predetermined rate and transporting the resulting vapors into said furnace to thereby generate phosphorus pentoxide vapors within said furnace; and transporting the phosphorus pentoxide vapors generated within said furnace past said silicon wafer to thereby cause diffusion of phosphorus atoms into the surface of said silicon wafer.

4. The method of diffusing phosphorus atoms into the surface of a body of semiconductor material, comprising the steps of:

maintaining the semiconductor body within a furnace heated to a predetermined temperature;

providing in said furnace a volatile phosphorus containing substance and a substantially water free oxygen atmosphere to oxidize said substance and produce anhydrous phosphorus pentoxide vapors, said substance not producing carbonaceous materials upon said oxidation; and transporting the phosphorus pentoxide vapors within said furnace past said semiconductor body to thereby cause diffusion of phosphorus atoms into the surface of said semiconductor body.

5. The method of diffusing phosphorus atoms into the surface of a body of semiconductor material, comprising the steps of:

maintaining the semiconductor body within a furnace heated to a predetermined tempertaure;

providing in said furnace a volatile phosphorus containing substance and a substantially water free oxygen atmosphere to oxidize said substance and produce anhydrous phosphorus pentoxide vapors, said substance not producing carbonaceous materials upon said oxidation, said substance being selected from the group consisting of the phosphorus halides, the phosphorus oxy-halides, the phosphorus mixed halides, and elemental phosphorus; and transporting the phosphorus pentoxide vapors within said furnace past said semiconductor body to thereby cause diffusion of phosphorus atoms into the surface of said semiconductor body.

6. The method of diffusing phosphorus atoms into the surface of a body of semiconductor material, comprising the steps of:

maintaining the semiconductor body within a furnace heated to a predetermined temperature:

providing in a reservoir a liquid volatile phosphorus containing substance; bubbling a predetermined oxygen bearing atmosphere through said liquid to oxidize said substance and produce anhydrous phosphorus pentoxide vapors; and transporting said vapors to said furnace and past said semiconductor body to thereby cause diffusion of phosphorus atoms into the surface of said semiconductor body.

7. The method of diffusing phosphorus atoms into the surface of a body of semiconductor material, comprising the steps of:

maintaining the semiconductor body within a furnace heated to a predetermined temperature;

providing in said furnace a solid volatile phosphorus containing substance and a substantially water free oxygen atmosphere to oxidize said substance and produce anhydrous phosphorus pentoxide vapors, said substance not producing carbonaceous materials upon said oxidation; and transporting the phosphorus pentoxide vapors generated within said furnace past said semiconductor body to thereby cause diffusion of phosphorus atoms into the surface of said semiconductor body.

8. The method of diffusing phosphorus atoms into the surface of a body of semiconductor material, comprising the steps of:

maintaining the semiconductor body within a furnace heated to a predetermined temperature;

providing in said furnace a predetermined mixture of substantially water free oxygen and a phosphorus containing gas, said gas having the characteristic of producing upon oxidation anhydrous phosphorus pentoxide and producing substantially no carbonaceous material; and transporting the phosphorus pentoxide vapors generated within said furnace past said semiconductor body to thereby cause diffusion of phosphorus atoms into the surface of said semiconductor body.

References Cited by the Examiner

UNITED STATES PATENTS

| | | | |
|---|---|---|---|
| 2,802,760 | 8/1957 | Derick et al. | 148—1.5 |
| 2,804,405 | 8/1957 | Derick et al. | 148—1.5 |
| 2,974,073 | 3/1961 | Armstrong | 148—1.5 |
| 3,164,501 | 1/1965 | Beale | 148—189 |

DAVID L. RECK, *Primary Examiner.*

BENJAMIN HENKIN, *Examiner.*